US009444033B2

(12) United States Patent
Cho et al.

(10) Patent No.: US 9,444,033 B2
(45) Date of Patent: Sep. 13, 2016

(54) MAGNETIC MEMORY DEVICE AND METHOD OF MANUFACTURING THE SAME

(71) Applicants: Yoonchul Cho, Seoul (KR); Ken Tokashiki, Seongnam-si (KR)

(72) Inventors: Yoonchul Cho, Seoul (KR); Ken Tokashiki, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 4 days.

(21) Appl. No.: 14/311,238

(22) Filed: Jun. 20, 2014

(65) Prior Publication Data

US 2015/0069560 A1 Mar. 12, 2015

(30) Foreign Application Priority Data

Sep. 9, 2013 (KR) .................. 10-2013-0108070

(51) Int. Cl.
*H01L 43/12* (2006.01)
*H01L 43/02* (2006.01)
*H01L 43/08* (2006.01)
*H01L 27/22* (2006.01)

(52) U.S. Cl.
CPC ............. *H01L 43/02* (2013.01); *H01L 27/226* (2013.01); *H01L 27/228* (2013.01); *H01L 43/08* (2013.01); *H01L 43/12* (2013.01)

(58) Field of Classification Search
CPC ....... H01L 43/02; H01L 43/08; H01L 43/12; H01L 27/228; H01L 27/226; H01L 27/222; H01L 27/224
See application file for complete search history.

(56) References Cited

U.S. PATENT DOCUMENTS

| 6,165,803 | A | 12/2000 | Chen et al. |
|---|---|---|---|
| 6,383,574 | B1 | 5/2002 | Han et al. |
| 6,884,632 | B2 | 4/2005 | Baglin et al. |
| 7,166,261 | B2 | 1/2007 | Kamata et al. |
| 7,211,446 | B2 | 5/2007 | Gaidis et |
| 7,611,911 | B2 | 11/2009 | Abraham et al. |
| 7,936,027 | B2 | 5/2011 | Xiao et al. |
| 7,985,667 | B2 | 7/2011 | Cho |
| 2004/0157346 | A1 | 8/2004 | Baglin et al. |
| 2004/0191557 | A1 | 9/2004 | Kamata et al. |
| 2005/0020076 | A1 | 1/2005 | Lee et al. |
| 2005/0079647 | A1 | 4/2005 | Abraham et al. |
| 2005/0174876 | A1* | 8/2005 | Katoh ................... B82Y 10/00 365/232 |
| 2005/0220991 | A1 | 10/2005 | Aoyama et al. |

(Continued)

FOREIGN PATENT DOCUMENTS

| JP | 2006060172 A | 3/2006 |
|---|---|---|
| JP | 2006173166 A | 6/2006 |

(Continued)

*Primary Examiner* — Zandra Smith
*Assistant Examiner* — Lauren R Bell
(74) *Attorney, Agent, or Firm* — Renaissance IP Law Group LLP

(57) ABSTRACT

Magnetic memory devices and methods of manufacturing the same are disclosed. A method may include forming a magnetic tunnel junction layer on a substrate, forming mask patterns on the magnetic tunnel junction layer, and sequentially performing a plurality of ion implantation processes using the mask patterns as ion implantation masks to form an isolation region in the magnetic tunnel junction layer. The isolation region may thereby define magnetic tunnel junction parts that are disposed under corresponding ones of the mask patterns. A magnetic memory device may include a plurality of magnetic tunnel junction parts electrically and magnetically isolated from each other through the isolation region.

8 Claims, 12 Drawing Sheets

(56) References Cited

U.S. PATENT DOCUMENTS

| | | |
|---|---|---|
| 2005/0277206 A1 | 12/2005 | Gaidis et al. |
| 2009/0173977 A1 | 7/2009 | Xiao et al. |
| 2010/0055804 A1 | 3/2010 | Cho |
| 2012/0170152 A1* | 7/2012 | Sonobe .................. B82Y 10/00 360/135 |
| 2013/0008867 A1 | 1/2013 | Tokashiki et al. |
| 2013/0037895 A1 | 2/2013 | Lee et al. |
| 2013/0288394 A1* | 10/2013 | Kontos .................. H01L 43/02 438/3 |

FOREIGN PATENT DOCUMENTS

| | | |
|---|---|---|
| JP | 2012142480 A | 7/2012 |
| KR | 20120086938 A | 8/2012 |
| KR | 101202685 B1 | 11/2012 |
| KR | 101222190 | 1/2013 |

* cited by examiner

MAGNETIC MEMORY DEVICE AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2013-0108070, filed on Sep. 9, 2013, in the Korean Intellectual Property Office, the disclosure of which is hereby incorporated by reference in its entirety.

BACKGROUND

The inventive concepts relate to semiconductor devices and methods of manufacturing the same and, more particularly, to magnetic memory devices and methods of manufacturing the same.

Semiconductor devices are widely used in the electronics industry because of their small size, multi-function capabilities, and/or low manufacturing costs. Semiconductor devices include, for instance, semiconductor memory devices storing logic data, semiconductor logic devices processing operations of logical data, and system-on-chips having the functions of both the semiconductor memory devices and the semiconductor logic devices.

Semiconductor memory devices that are magnetic memory devices may store logic data using magnetization directions of magnetic bodies. As semiconductor devices have become more highly integrated, widths and spaces of patterns in magnetic memory devices have been reduced. Thus, the reliability of magnetic memory devices may be deteriorated.

SUMMARY

Embodiments of the inventive concepts may provide magnetic memory devices with excellent reliability, along with methods of manufacturing the same.

Embodiments of the inventive concepts may also provide highly integrated magnetic memory devices, along with methods of manufacturing the same.

In one aspect, a method of manufacturing a magnetic memory device may include: forming a magnetic tunnel junction layer on a substrate; forming a plurality of mask patterns on the magnetic tunnel junction layer; and sequentially performing a plurality of ion implantation processes using the mask patterns as ion implantation masks to form an isolation region in the magnetic tunnel junction layer. The isolation region may define magnetic tunnel junction parts that each are disposed under corresponding ones of the mask patterns, respectively.

In some embodiments, sequentially performing the plurality of ion implantation processes may include: performing a first ion implantation process implanting first impurities; and performing a second ion implantation process implanting second impurities.

In some embodiments, the first impurities may be different from the second impurities.

In some embodiments, the first impurities may comprise impurities of a first impurity group, and the second impurities may comprise impurities of a second impurity group. At least one of the first and second impurity groups may impart a magnetic isolation property to the isolation region, and the other of the first and second impurity groups may impart electrical and magnetic isolation properties to the isolation region.

In some embodiments, an amorphous region may be formed in the magnetic tunnel junction layer by the first ion implantation process, and the second ion implantation process may be performed on the amorphous region.

In some embodiments, the method may further include: conformally forming a capping insulating layer on the substrate having the mask patterns before performing the first ion implantation process.

In some embodiments, the method may further include: forming a lower electrode layer on the substrate before forming the magnetic tunnel junction layer. In this case, sequentially performing the plurality of ion implantation processes may include: sequentially performing the plurality of ion implantation processes using the mask patterns as ion implantation masks to form the isolation region in the magnetic tunnel junction layer and the lower electrode layer. The isolation region may further define lower electrodes that are each disposed under a corresponding one of the magnetic tunnel junction parts, respectively.

In some embodiments, the mask patterns may include upper electrodes, and each of the upper electrodes may be in contact with a top surface of a corresponding one of the magnetic tunnel junction parts.

In some embodiments, metal atoms in the isolation region may be segregated to a top surface of the isolation region by impurities of the plurality of ion implantation processes. In this case, the method may further include: removing some or substantially all of the segregated metal atoms from the top surface of the isolation region after forming the isolation region.

In another aspect, a magnetic memory device may include: a magnetic tunnel junction layer disposed on a substrate; an isolation region formed in the magnetic tunnel junction layer, the isolation region defining magnetic tunnel junction parts spaced apart from each other; and mask patterns disposed on the magnetic tunnel junction parts. The isolation region may include first impurities, second impurities different from the first impurities, and an element that is the same as at least one of the elements included in the magnetic tunnel junction part.

In some embodiments, the first impurities may impart a magnetic isolation property to the isolation region, and the second impurities may impart both an electrical isolation property and a magnetic isolation property to the isolation region.

In some embodiments, the magnetic memory device may further include: lower electrodes disposed under the magnetic tunnel junction parts. In this case, the isolation region may extend downward, so as to be disposed between the lower electrodes. And at least a lower portion of the isolation region may further include an element that is the same as an element of the lower electrode.

In some embodiments, the mask patterns may include upper electrodes, and the upper electrodes may be in contact with corresponding top surfaces of the magnetic tunnel junction parts.

In some embodiments, each of the upper electrodes may include a conductive barrier pattern and a metal pattern which are sequentially stacked.

In some embodiments, a top surface of the isolation region may be lower than a top surface of the magnetic tunnel junction part.

BRIEF DESCRIPTION OF THE DRAWINGS

The inventive concepts will become more apparent in view of the attached drawings and accompanying detailed description, in which:

FIGS. 1A to 5A are cross-sectional views of a partially constructed magnetic memory device illustrating a method of manufacturing a magnetic memory device according to example embodiments of the inventive concepts;

FIGS. 1B to 5B are enlarged views of portion 'A' of FIGS. 1A to 5A, respectively;

DETAILED DESCRIPTION OF THE EMBODIMENTS

Figure 1A:
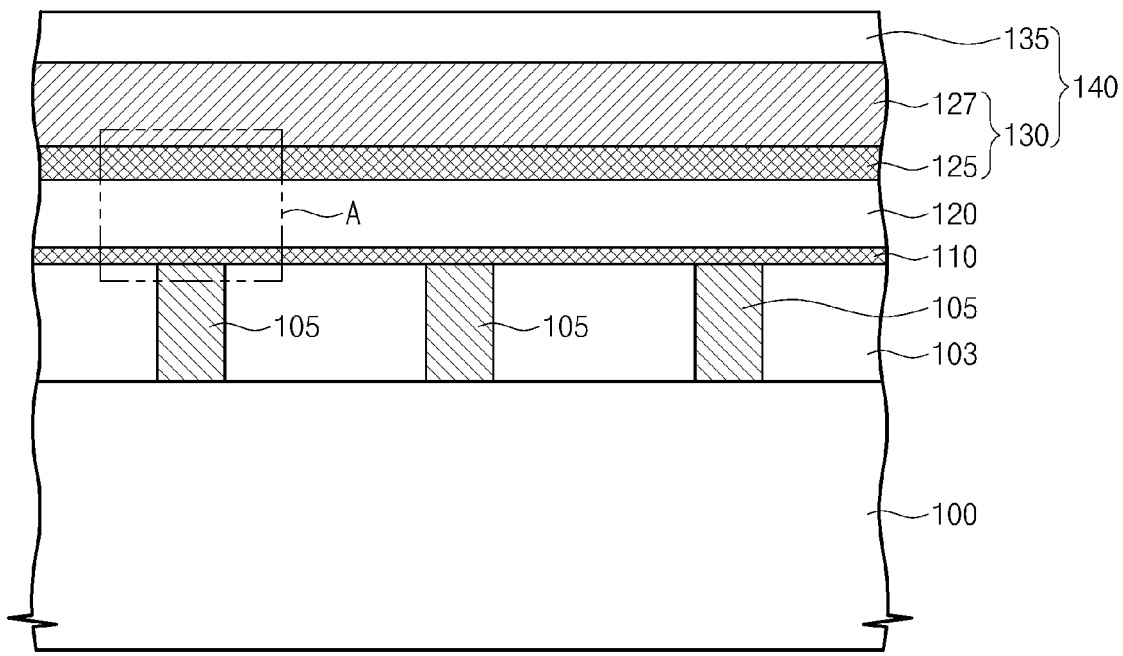

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments. It should be noted, however, that the inventive concepts are not limited to the following embodiments, and may be implemented in various forms. Accordingly, the exemplary embodiments are provided herein to disclose the inventive concepts and let those skilled in the art know the category of the inventive concepts, and not to limit the scope of the inventive concepts. In the drawings, the inventive concepts are not limited to the specific examples shown, and regions and portions of the embodiments shown therein may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The exemplary embodiments are described herein with reference to cross-sectional and/or planar illustrations that are idealized exemplary illustrations. Accordingly, variations from the shapes of the elements and features shown in the illustrations that result, for example, from manufacturing techniques and/or acceptable tolerances, are to be expected. Thus, the exemplary embodiments should not be construed as being limited to the shapes of regions, features, or elements illustrated herein, but are to be construed to include deviations in shapes that result, for example, from manufacturing. For example, an etching region illustrated as a rectangle will, typically, have rounded or curved features. Thus, the regions, features, and elements illustrated in the figures are schematic in nature, and their shapes are not intended to illustrate the actual shape of a region, feature, or element of a device, and are therefore not intended to limit the scope of the inventive concepts. Therefore, the inventive concepts are not limited to the specific shapes and configurations of elements and features illustrated in the exemplary views, but may include other shapes or configurations.

It should also be understood that although the terms first, second, third, etc., may be used herein to describe various elements, the elements should not be limited by these terms. Rather, these terms are only used to distinguish one element from another element. Thus, a first element in some embodiments could be termed a second element in other embodiments, and so forth, without departing from the teachings of the present invention. Exemplary embodiments of aspects of the present inventive concepts explained and illustrated herein include their complementary counterparts. The same reference numerals or designators denote the same or similar elements or features throughout the specification.

FIGS. 1A to 5A are cross-sectional views of a magnetic memory device illustrating a method of manufacturing a magnetic memory device according to example embodiments of the inventive concepts, and FIGS. 1B to 5B are enlarged views of portion 'A' of FIGS. 1A to 5A, respectively. FIG. 6 is a flowchart illustrating a method of forming an isolation region and a magnetic tunnel junction part of a magnetic memory device according to example embodiments of the inventive concepts.

Figure 1B:
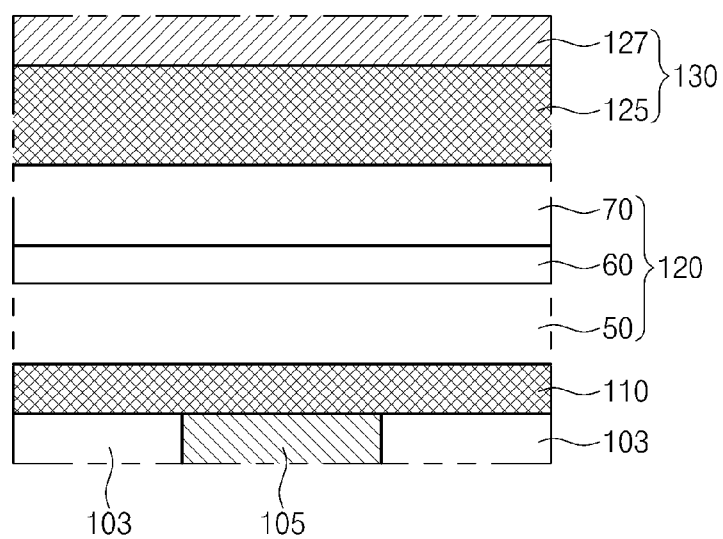

Referring to FIGS. 1A, 1B and 6, a lower interlayer insulating layer 103 may be formed on a substrate 100. The substrate 100 may include a semiconductor substrate (e.g., a silicon substrate, a germanium substrate, or a silicon-germanium substrate). In some embodiments, the substrate 100 may further include switching elements (not shown) formed on the semiconductor substrate. The switching elements may, for example, be field effect transistors or PN diodes. The lower interlayer insulating layer 103 may cover the switching elements. The lower interlayer insulating layer 103 may, for instance, include a silicon oxide layer, a silicon nitride layer, and/or a silicon oxynitride layer.

Contact plugs 105 may be formed to penetrate the lower interlayer insulating layer 103. Each contact plug 105 may be electrically connected to one terminal of a corresponding switching element. The contact plugs 105 may be formed of a conductive material. For example, the contact plugs 105 may include at least one of a doped semiconductor material, a metal (e.g., titanium, tantalum, and/or tungsten), a conductive metal nitride (e.g., titanium nitride and/or tantalum nitride), and a metal-semiconductor compound (e.g., a metal silicide).

A lower electrode layer 110 may be formed on the lower interlayer insulating layer 103 and the contact plugs 105. The lower electrode layer 110 may include at least one of a conductive metal nitride (e.g., titanium nitride and/or tantalum nitride) and a metal (e.g., titanium and/or tantalum).

A magnetic tunnel junction layer 120 may be formed on the lower electrode layer 110, in a process step (S200). As illustrated in FIG. 1B, the magnetic tunnel junction layer 120 may include a reference layer 50, a free layer 70, and a tunnel barrier layer 60 disposed between the reference layer 50 and the free layer 70. The reference layer 50 may include a magnetic material and/or a magnetic structure that has a magnetization direction fixed in one direction. The free layer 70 may include a magnetic material and/or a magnetic structure that has a magnetization direction changeable between a direction that is parallel to the magnetization direction of the reference layer 50 and a direction that is anti-parallel to the magnetization direction of the reference layer 50.

Figure 7A:
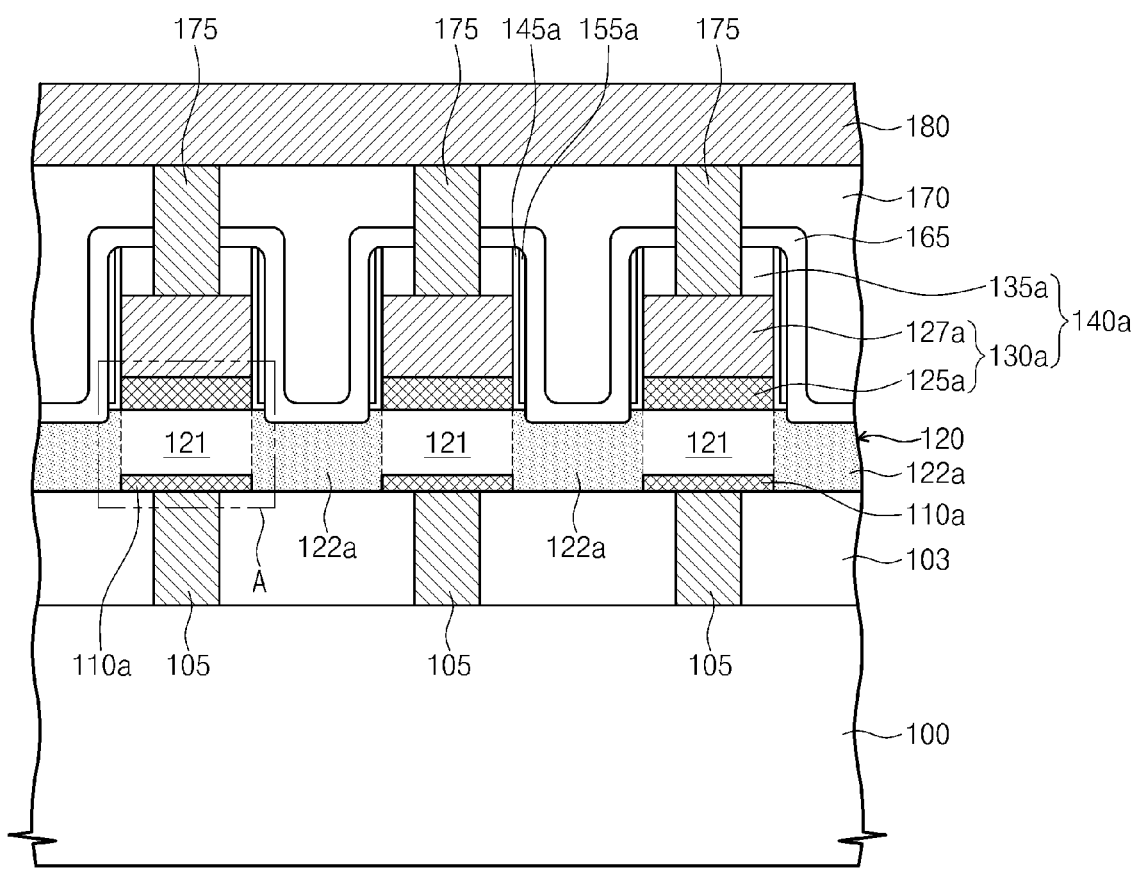
FIG. 7A is a cross-sectional view of a magnetic memory device constructed according to example embodiments of the inventive concepts.
Figure 7B:
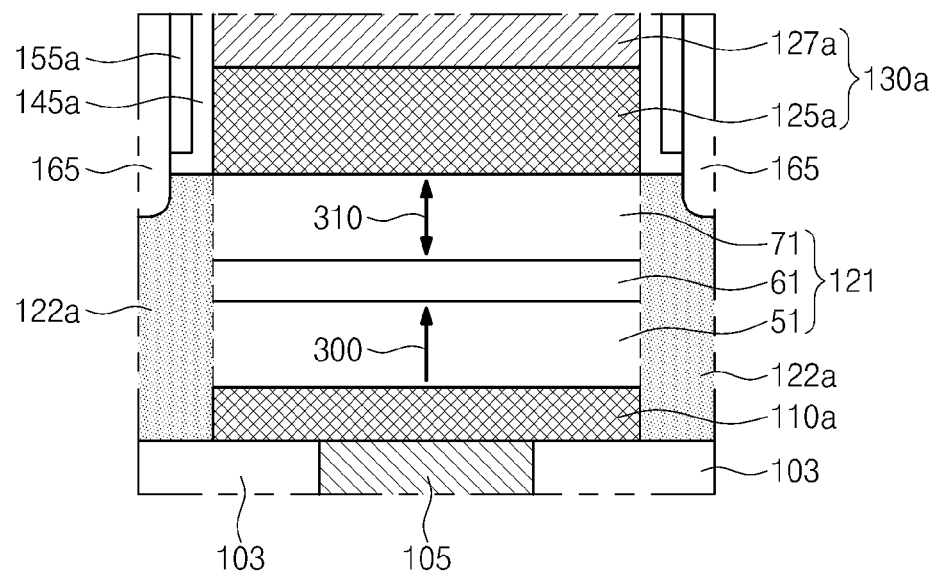
FIG. 7B is an enlarged view of a portion 'A' of FIG. 7A.

In some embodiments, each of the reference layer 50 and the free layer 70 may include a perpendicular magnetic structure and/or a perpendicular magnetic material that has a magnetization direction substantially perpendicular to a top surface of the substrate 100, as illustrated in FIG. 7B. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where "n" is the number of times the magnetic layer and the non-magnetic layer are stacked). For example, the perpendicular magnetic material may include CoFeTb, CoFeGd, and/or CoFeDy, or a perpendicular magnetic material having an $L1_0$ structure (e.g., FePt of the $L1_0$ structure, FePd of the $L1_0$ structure, CoPd of the $L1_0$ structure, or CoPt of the $L1_0$ structure). Here, the reference layer 50 may be thicker than the free layer 70, and/or a coercive force of the reference layer 50 may be greater than a coercive force of the free layer 70.

Figure 8:
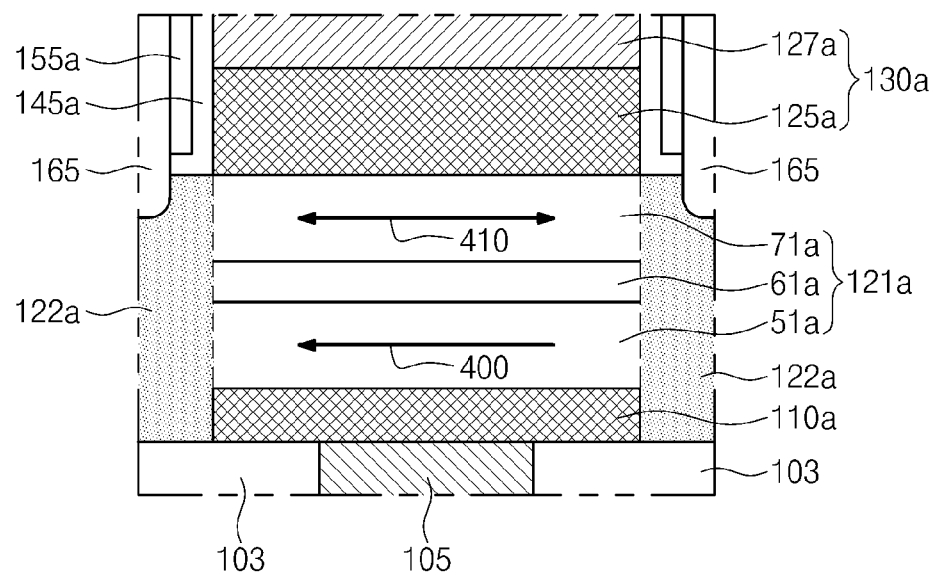
FIG. 8 is a cross-sectional view of a magnetic tunnel junction part of a magnetic memory device according to another example embodiment of the inventive concepts.

In other embodiments, each of the reference layer 50 and the free layer 70 may include a horizontal magnetic material having a magnetization direction substantially horizontal to the top surface of the substrate 10, as illustrated in FIG. 8. In this case, each of the reference layer 50 and the free layer 70 may include a ferromagnetic material (e.g., CoFeB, CoFe, NiFe, or CoFeNi). The reference layer 50 may further include an anti-ferromagnetic material (e.g., PtMn, IrMn, MnO, MnS, or MnTe) pinning a magnetization direction of the ferromagnetic material in the reference layer 50. In this case, the reference layer 60 may have a synthetic anti-ferromagnetic (SAF) structure.

The tunnel barrier layer 60 may include at least one of magnesium oxide, titanium oxide, aluminum oxide, magnesium-zinc oxide, or magnesium-boron oxide.

As illustrated in FIG. 1B, the reference layer 50, the tunnel barrier layer 60, and the free layer 70 may be sequentially stacked on the lower electrode layer 110. Alternatively, the free layer 70 may be disposed under the tunnel barrier layer 60 and the reference layer 50 may be disposed on the tunnel barrier layer 60.

A mask layer 140 may be formed on the magnetic tunnel junction layer 120. In some embodiments, the mask layer 140 may include an upper electrode layer 130 and a hardmask layer 135 that are sequentially stacked on the magnetic tunnel junction layer 120. The hardmask layer 135 may be formed of an insulating layer (e.g., a silicon oxide layer, a silicon nitride layer, and/or a silicon oxynitride layer). The upper electrode layer 130 may be formed of a conductive material. The upper electrode layer 130 may be in contact with a top surface of the magnetic tunnel junction layer 120.

In some embodiments, the upper electrode layer 130 may include a conductive barrier layer 125 and a metal layer 127 that are sequentially stacked. For example, the conductive barrier layer 125 may include a conductive metal nitride layer (e.g., a titanium nitride layer, a tantalum nitride layer, and/or a tungsten nitride layer). The metal layer 127 may, for instance, include a tungsten layer.

Figure 2A:
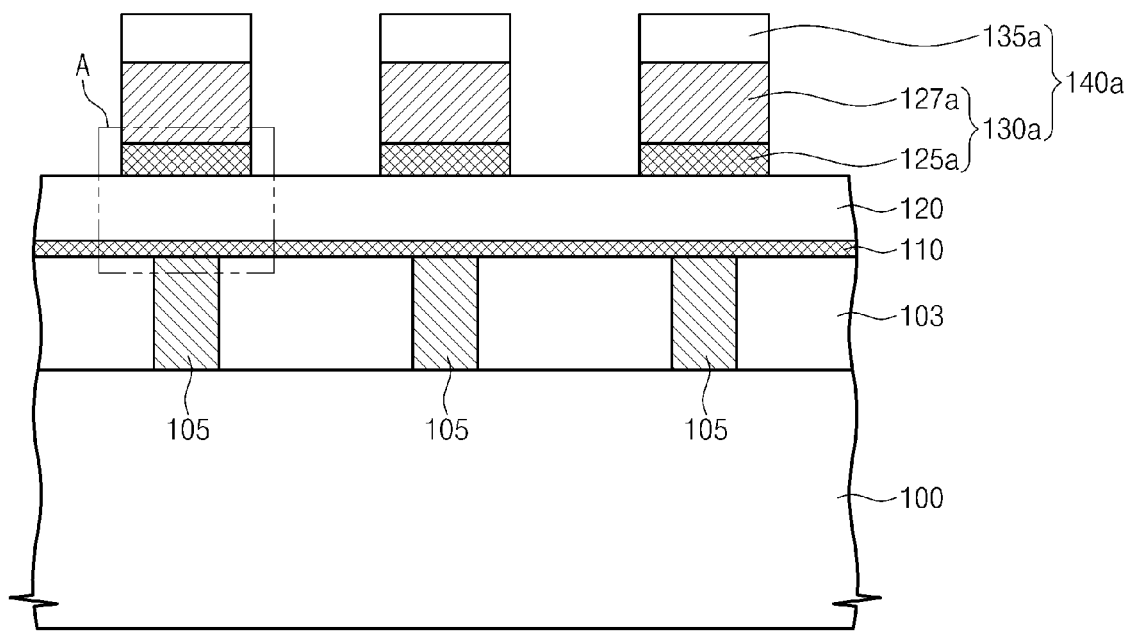
Figure 2B:
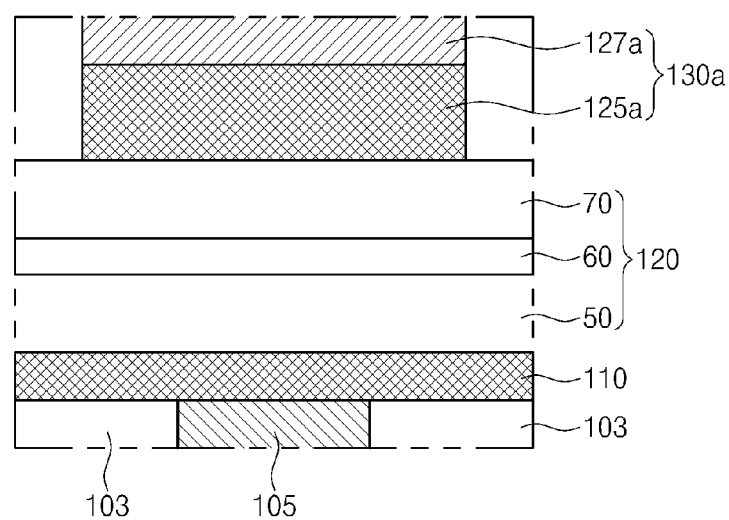

Referring to FIGS. 2A, 2B, and 6, the mask layer 140 may be patterned to form mask patterns 140a on the magnetic tunnel junction layer 120 (S210). The mask patterns 140a may be spaced apart from each other. The magnetic tunnel junction layer 120 may be exposed between the mask patterns 140a.

Each mask pattern 140a may include an upper electrode 130a and a hardmask pattern 135a that are sequentially stacked. The upper electrode 130a may include a conductive barrier pattern 125a and a metal pattern 127a that are sequentially stacked.

Referring to FIGS. 3A, 3B, 4A, 4B, and 6, a plurality of ion implantation processes may be sequentially performed using the mask patterns 140a as ion implantation masks to form an isolation region 122a, in a process step (S220). In some embodiments, the plurality of ion implantation processes may include a first ion implantation process, represented by arrows 150, and a second ion implantation process, represented by arrows 160.

Figure 3A:
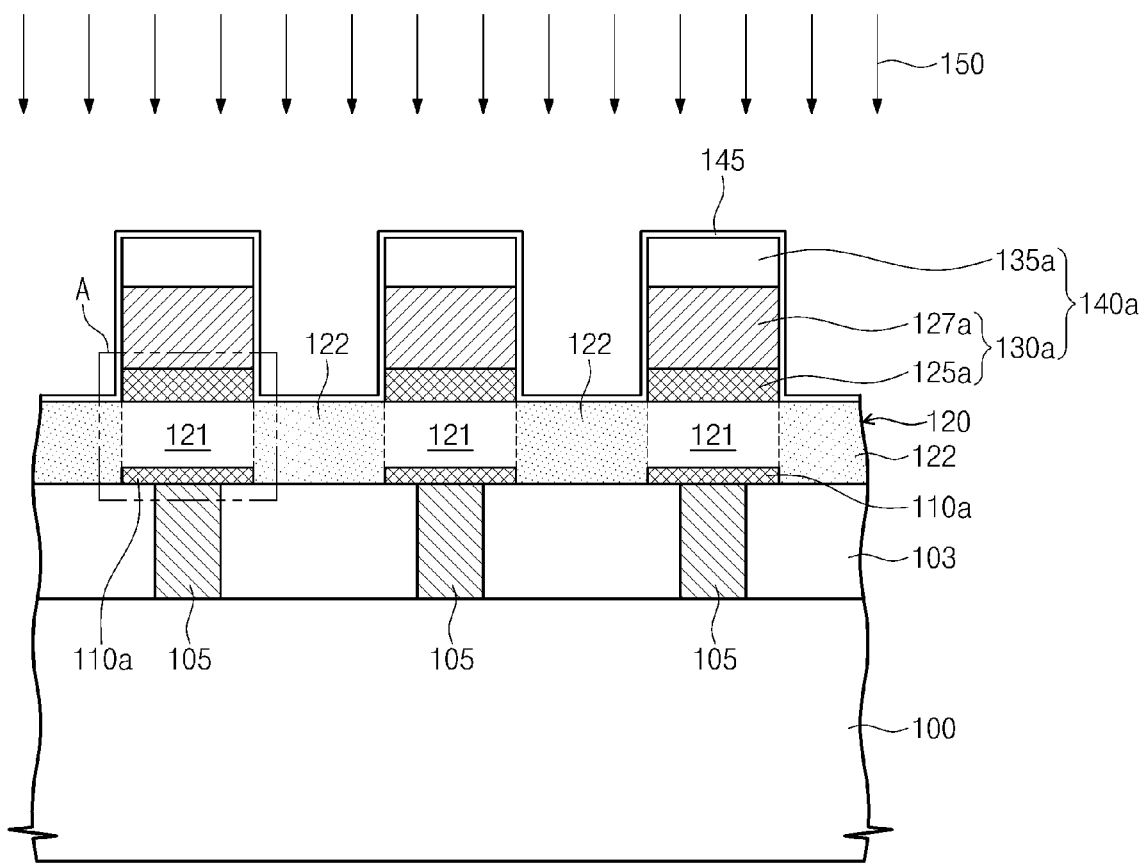
Figure 3B:
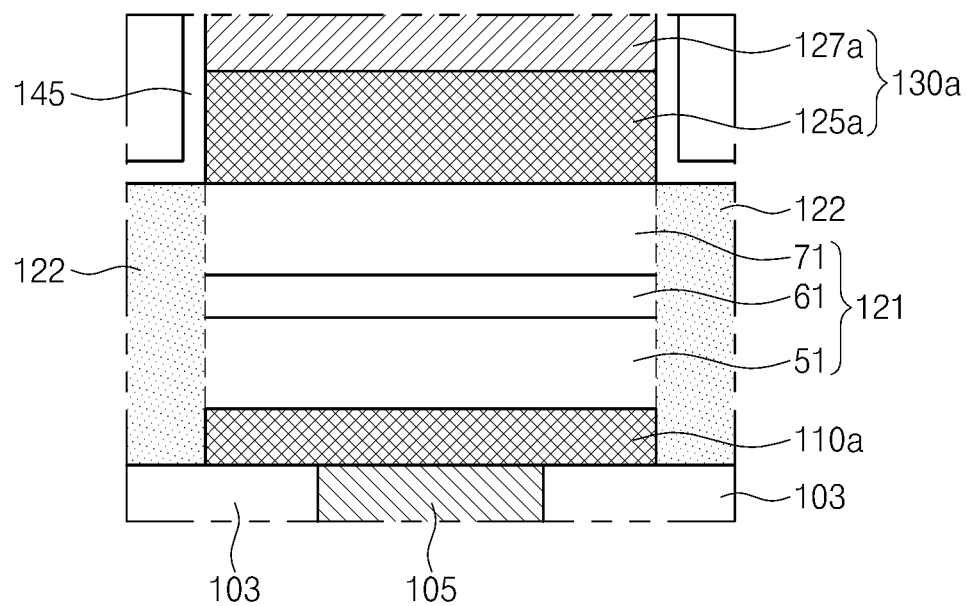

More particularly, the first ion implantation process 150 may be performed using the mask patterns 140a as ion implantation masks, as illustrated for example in FIGS. 3A and 3B. First impurities may be injected into the magnetic tunnel junction layer 120 between the mask patterns 140a by the first ion implantation process 150, thereby forming a first impurity injection region 122. At this time, the first impurities may also be injected into the lower electrode layer 110 under the magnetic tunnel junction layer 120. Thus, the first impurity injection region 122 is formed in the magnetic tunnel junction layer 120 and the lower electrode layer 110.

The first impurity injection region 122 defines magnetic tunnel junction parts 121 that are disposed under the mask patterns 140a, respectively. In other words, the first impurity injection region 122 is disposed between the magnetic tunnel junction parts 121. The magnetic tunnel junction parts 121 respectively correspond to portions of the magnetic tunnel junction layer 120 that are disposed under the mask patterns 140a. In other words, the magnetic tunnel junction parts 121 are covered by the mask patterns 140a in the first ion implantation process 150, such that the first impurities are not injected into the magnetic tunnel junction parts 121. The magnetic tunnel junction parts 121 are spaced apart from each other. As illustrated in FIG. 3B, each of the magnetic tunnel junction parts 121 may include a reference pattern 51, a free pattern 71, and a tunnel barrier pattern 61 disposed between the reference and free patterns 51 and 71. The reference pattern 51, the tunnel barrier pattern 61, and the free pattern 71 correspond to a portion of the reference layer 50, a portion of the tunnel barrier layer 60, and a portion of the free layer 70, respectively, that are disposed under the mask pattern 140a.

Additionally, the first impurity injection region 122 may further define lower electrodes 110a that are disposed under corresponding ones of the magnetic tunnel junction parts 121. The lower electrodes 110a are also spaced apart from each other. In other words, the first impurity injection region 122 may also be disposed between the lower electrodes 110a. The lower electrodes 110a correspond to portions of the lower electrode layer 110 that are disposed under the mask patterns 140a. The lower electrodes 110a may be connected to corresponding ones of the contact plugs 105.

The first impurity injection region 122 may therefore include the first impurities and an element that is the same as at least one of the elements in the magnetic tunnel junction part 121. At least a lower portion of the first impurity injection region 122 arranged between the lower electrodes 110a may further include an element that is the same as an element in the lower electrode 110a.

Before the first ion implantation process 150 is performed, a first capping insulating layer 145 may be conformally formed on the substrate 100 having the mask patterns 140a. The first capping insulating layer 145 may protect the magnetic tunnel junction layer 120 when the first ion implantation process 150 is performed. For example, deterioration of a magnetism of the magnetic tunnel junction parts 121 may be minimized or prevented using the first capping insulating layer 145. Additionally, profiles of the magnetic tunnel junction parts 121 may be better secured using the first capping insulating layer 145. For example, the first capping insulating layer 145 may include silicon nitride (SiN), silicon oxide (SiO2), carbon (C), silicon-carbon nitride (SiCN), silicon oxynitride (SiON), and/or a low-k dielectric material.

In some embodiments, the first impurity injection region 122 may be an amorphous region. In other words, the first impurity injection region 122 may be formed in an amorphous state by the injected first impurities.

Figure 4A:
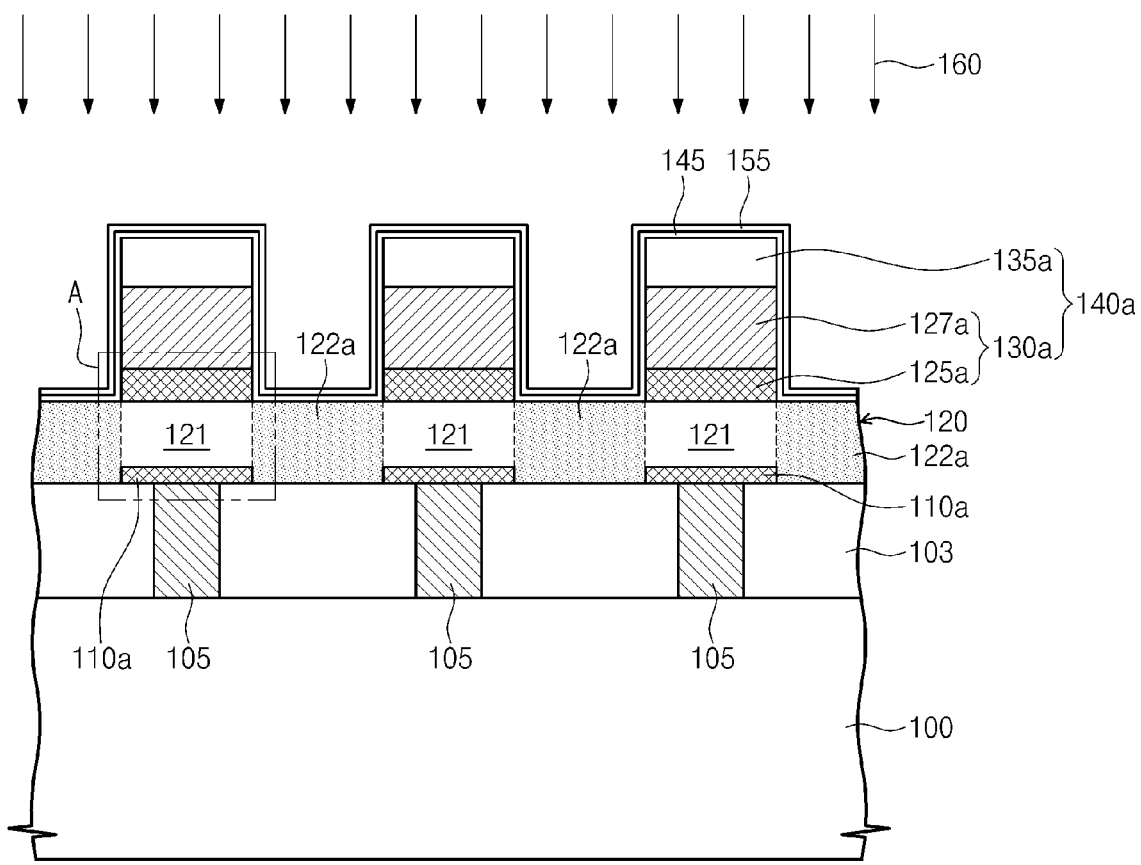
Figure 4B:
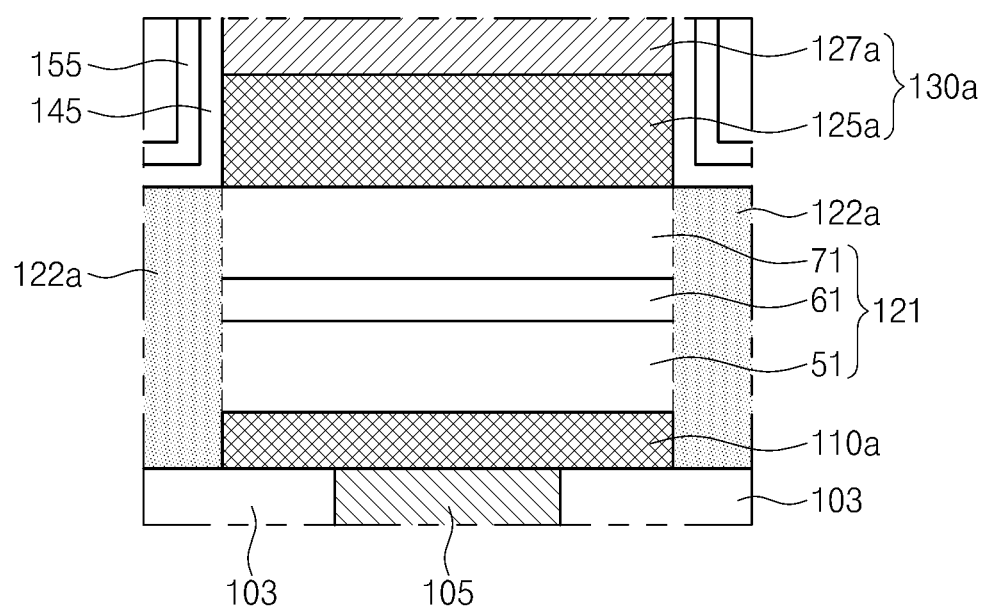

As illustrated in FIGS. 4A and 4B, the second ion implantation process, illustrated by arrows 160, may be performed after the first ion implantation process 150. A second capping insulating layer 155 may be conformally formed on the substrate 100 after the first ion implantation process 150 and before the second ion implantation process 160. The second capping insulating layer 155 may protect the magnetic tunnel junction parts 121 from the second ion implantation process 160. In other words, the second capping insulating layer 155 may minimize or prevent deterioration of the magnetism of the magnetic tunnel junction parts 121 and may better secure profiles of the magnetic tunnel junction parts 121 when the second ion implantation process 160 is performed. The second capping insulating layer 155 may, for example, include silicon nitride (SiN), silicon oxide (SiO2), carbon (C), silicon-carbon nitride (SiCN), silicon oxynitride (SiON), and/or a low-k dielectric material.

In some embodiments, the first capping insulating layer 145 may be removed after the first ion implantation process 150. In this case, the second capping insulating layer 155 may be formed directly on the first impurity injection region 121. In other embodiments, at least a portion of the first capping insulating layer 145 may remain after the first ion implantation process 150. In this case, the second capping insulating layer 155 may be formed on the remaining portion of the first capping insulating layer 145. In still other embodiments, where at least a portion of the first capping insulating layer 145 remains after the first ion implantation process 150, the second capping insulating layer 155 may be omitted.

Second impurities may be injected into the first impurity injection region 122 by the second ion implantation process 160, thereby forming the isolation region 122a. The magnetic tunnel junction parts 121 may be electrically and magnetically isolated from each other by the isolation region 122a. Additionally, the lower electrodes 110a may be electrically isolated from each other by the isolation region 122a. In other words, the lower electrodes 110a can be electrically isolated from each other by a lower portion of the isolation region 122a formed by providing the impurities of the plurality of ion implantation processes into the lower electrode layer 110.

In some embodiments, the first impurities may be different from the second impurities. For instance, a kind or type of the first impurities may be different from a kind or type of the second impurities. The first impurities of the first ion implantation process 150 may be defined as part of a first impurity group, and the second impurities of the second ion implantation process may be defined as part of a second impurity group. At least one of the first and second impurity groups can impart a magnetic isolation property to the isolation region 122a, and the other of the first and second impurity groups can impart an electrical isolation property as well as a magnetic isolation property to the isolation region 122a.

In some embodiments, the first impurities of the first ion implantation process 150 may impart the magnetic isolation property to the isolation region 122a. In this case, the first impurities may include at least one of arsenic (As), phosphorus (P), nitrogen (N), boron (B), carbon (C), silicon (Si), gallium (Ga), germanium (Ge), selenium (Se), indium (In), tin (Sn), antimony (Sb), lead (Pb), neon (Ne), argon (Ar), krypton (Kr), and xenon (Xe). The second impurities of the second ion implantation process 160 may impart the electrical isolation property and the magnetic isolation property to the isolation region 122a. In this case, the second impurities may include at least one of oxygen (O) and nitrogen (N). In one embodiment, the second impurities may only include oxygen (O).

In other embodiments, the first impurities of the first ion implantation process 150 may impart the electrical isolation property and the magnetic isolation property to the isolation region 122a, and the second impurities of the second ion implantation process 160 may impart the magnetic isolation property to the isolation region 122a. In this case, the first impurities may include at least one of oxygen (O) and nitrogen (N), and the second impurities may include at least one of arsenic (As), phosphorus (P), nitrogen (N), boron (B), carbon (C), silicon (Si), gallium (Ga), germanium (Ge), selenium (Se), indium (In), tin (Sn), antimony (Sb), lead (Pb), neon (Ne), argon (Ar), krypton (Kr), and xenon (Xe).

In some embodiments, a dose of the first ion implantation process 150 may be different from a dose of the second ion implantation process 160. For example, the dose of the first ion implantation process 150 may be less than the dose of the second ion implantation process 160. Alternatively, the dose of the first ion implantation process 150 may be greater than the dose of the second ion implantation process 160. In other embodiments, the dose of the first ion implantation process 150 may be substantially equal to the dose of the second ion implantation process 160.

As described above, the magnetic tunnel junction parts 121 may be magnetically and electrically isolated from each other by the isolation region 122a formed in the magnetic tunnel junction layer 120. In other words, the magnetic tunnel junction parts 121 are not separated from each other by an etching process, but are instead separated from each other by the ion implantation processes. Thus, various problems that may be caused by an etching process can be prevented. For example, using the principles of the inventive concepts, it is possible to prevent a process margin deficiency caused by pitch reduction and/or a short fail caused by an etch byproduct.

Additionally, the isolation region 122a may be formed by sequentially performing the plurality of ion implantation processes. Thus, the doses of the ion implantation processes can be reduced. In more detail, the first impurity injection region 122 formed by the first ion implantation process 150 may be in the amorphous state. In other words, a bonding force between atoms may become weak and/or bonds between the atoms may be broken due to the first impurity injection 122. Thus, even though the dose of the second ion implantation process 160 is reduced, the first and second impurities may react with other atoms in the isolation region 122a so that the isolation region 122a may have the desired magnetic and electrical isolation properties.

If a single ion implantation process is performed to form an isolation region, a dose of the ion implantation process may be higher to impart both magnetic and electrical isolation between magnetic tunnel junction parts. In this case, the mask patterns 140a may be damaged or partially removed by the high dose. In particular, the upper electrode 130a in the mask pattern 140a may be damaged and thereby increase a contact resistance between the upper electrode 130a and a subsequent conductor (e.g., an upper contact plug) connected to the upper electrode 130a. However, according to the aforementioned embodiments of the inventive concepts, by forming the isolation region 122a using the plurality of ion implantation processes, relatively low doses can be used. Thus, damage to the mask patterns 140a (e.g., the upper electrodes 130a) may be reduced or minimized while producing a magnetic memory device having excellent reliability and a high integration density.

In the aforementioned embodiments, the plurality of ion implantation processes may include the first and second ion implantation processes 150 and 160. However, the inventive concepts are not limited thereto. In other embodiments, the plurality of ion implantation processes may further include at least one additional ion implantation process performed after the second ion implantation process 160. Impurities of the additional ion implantation process may, for instance, include the first impurities, the second impurities, or a mixture of the first and second impurities. Alternatively, third impurities, different from either of the first and second impurities, could be used. An additional capping insulating layer may be formed on the substrate 100 just before the additional ion implantation process. The additional capping insulating layer may, for example, be formed of the same material as the first capping insulating layer 145.

In the aforementioned embodiments, the first impurities are different from the second impurities. However, the inventive concepts are not limited thereto. In other embodiments, the kind of the first impurities may be the same as the kind of the second impurities. In this case, all of the first and second impurities may provide the electrical and magnetic isolation properties to the isolation region 122a. For example, at least one of the first and second impurities may include at least one of oxygen and nitrogen. In particular, at least one of the first and second impurities may include oxygen.

Figure 5A:
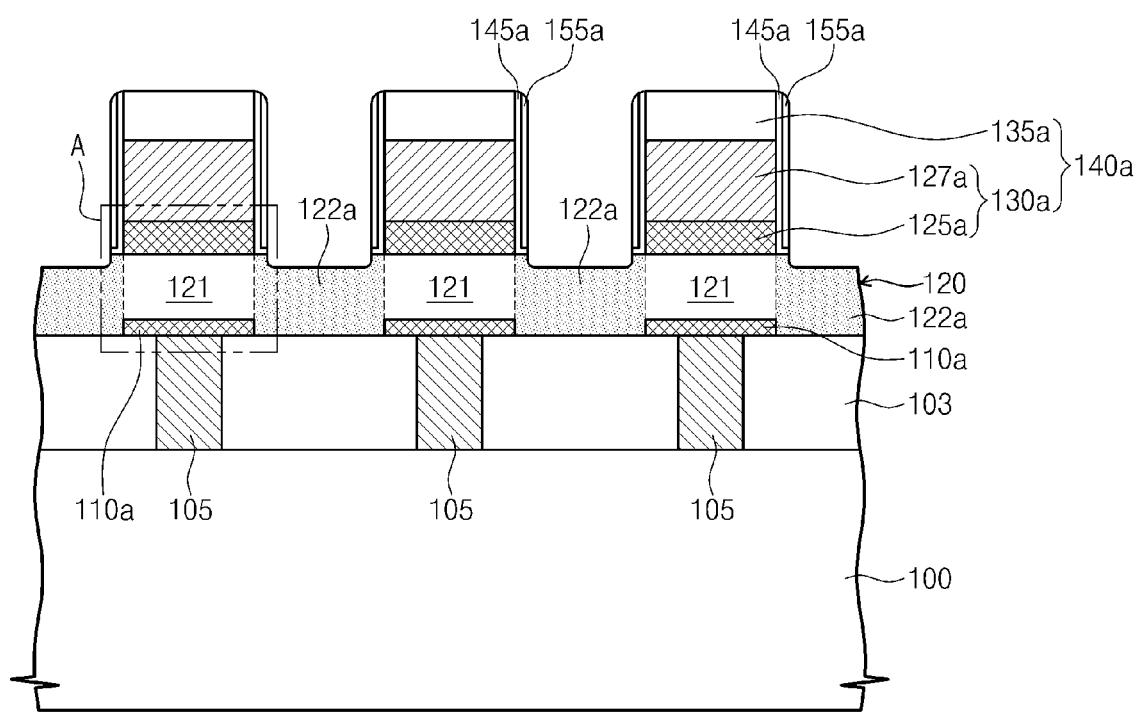
Figure 5B:
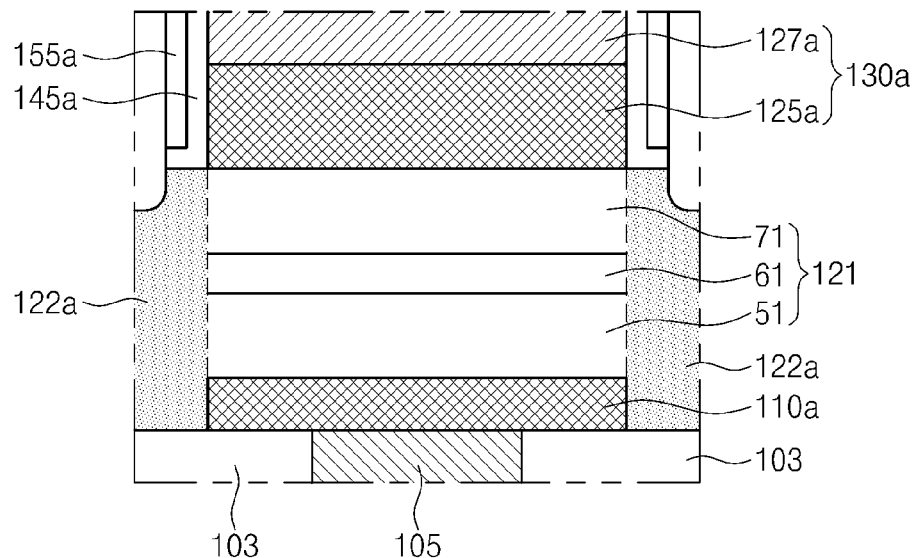
Figure 6:
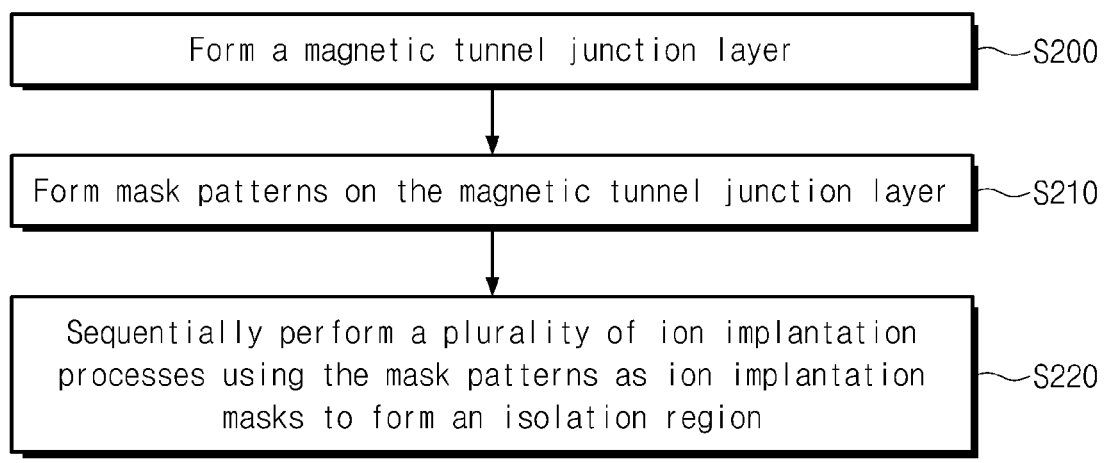
FIG. 6 is a flowchart illustrating a method of forming an isolation region and a magnetic tunnel junction part of a magnetic memory device according to example embodiments of the inventive concepts.

Referring to FIGS. 5A and 5B, in some embodiments, the impurities of the plurality of ion implantation processes may be injected into the isolation region 122a such that metal atoms in the isolation region 122a may be segregated to a top surface of the isolation region 122a. Thus, a segregation layer including the metal atoms may be formed at the top surface of the isolation region 122a. In this case, the metal atoms segregated to the top surface of the isolation region 122a may be removed or at least substantially removed by an etching process. At this time, however, the isolation region 122a under the segregation layer remains. Thus, a top surface of the isolation region 122a may be lower than a top surface of the magnetic tunnel junction part 121. The segregation layer may be removed, for example, by an reactive etching process, an anisotropic etching process (e.g., a dry etching process, an reactive ion etching process, or an ion beam etching process), or an isotropic etching process (e.g., a wet etching process). The segregated metal atoms may be the same as at least one of the elements included in the magnetic tunnel junction parts 121.

If the first and/or second capping insulating layers 145 and/or 155 remain on the isolation region 122a, the first and/or second capping insulating layers 145 and/or 155, and the segregation layer thereunder, may be etched. In some embodiments, if the segregation layer is etched by the anisotropic etching process, a first capping insulating spacer 145a and a second capping insulating spacer 155a may be sequentially formed on a sidewall of each mask pattern 140a. The first and second capping insulating spacers 145a and 155a may correspond to residual portions of the first and second capping insulating layers 145 and 155, respectively. In other embodiments, if the segregation layer is removed by the isotropic etching process, the first and second capping insulating layers 145 and 155 on the sidewall of each mask pattern 140a may also be removed. In still other embodiments, the first and second capping insulating layers 145 and 155 may be removed by the plurality of ion implantation processes.

In other embodiments, the segregation layer may not be generated. In this case, the process of removing the segregation layer may be omitted.

Subsequent processes will now be described with reference to FIG. 7A. Referring to FIG. 7A, a protection insulating layer 165 may be conformally formed on an entire top surface of the substrate 100. The protection insulating layer 165 may include a silicon nitride layer and/or a silicon oxynitride layer. An upper interlayer insulating layer 170 may be formed on the protection insulating layer 165. The upper interlayer insulating layer 170 may include a silicon oxide layer.

Next, upper contact plugs 175 may be formed to penetrate the upper interlayer insulating layer 170, the protection insulating layer 165, and the hardmask patterns 135a. The upper contact plugs 175 may be connected to corresponding ones of the upper electrodes 130a. In some embodiments, the hardmask patterns 135a may be removed by the plurality of ion implantation processes and/or the process of removing the segregation layer. In this case, the upper contact plugs 175 may penetrate the upper interlayer insulating layer 170 and the protection insulating layer 165.

The upper contact plugs 175 may include at least one of a metal (e.g., titanium, tantalum, and/or tungsten) and a conductive metal nitride (e.g., titanium nitride, tantalum nitride, and/or tungsten nitride). An interconnection 180 may be formed on the upper interlayer insulating layer 170. The interconnection 180 may be connected to each of the upper contact plugs 175 arranged along one direction. For instance, in some embodiments, the interconnection 180 may correspond to a bit line. The interconnection 180 may include at least one of a metal (e.g., titanium, tantalum, and/or tungsten) and a conductive metal nitride (e.g., titanium nitride, tantalum nitride, and/or tungsten nitride).

FIG. 7A is a cross-sectional view illustrating a magnetic memory device according to example embodiments of the inventive concepts, and FIG. 7B is an enlarged view of a portion 'A' of FIG. 7A. FIG. 8 is a cross-sectional view illustrating a modified example of a magnetic tunnel junction part of a magnetic memory device according to example embodiments of the inventive concepts. Hereinafter, redundant descriptions will be omitted or described only briefly for the purpose of ease and convenience in explanation.

Referring to FIGS. 7A and 7B, a lower interlayer insulating layer 103 may be disposed on a substrate 100. The lower interlayer insulating layer 103 may cover switching elements (not shown) formed on the substrate 100. Contact plugs 105 may penetrate the lower interlayer insulating layer 103. Each contact plug 105 may be connected to a terminal of a corresponding switching element.

A magnetic tunnel insulating layer 120 may be disposed on the lower interlayer insulating layer 103. An isolation region 122a may be formed in the magnetic tunnel insulating layer 120 to define magnetic tunnel junction parts 121 spaced apart from each other. In other words, the magnetic tunnel junction parts 121 may be electrically and magnetically isolated from each other by the isolation region 122a. Mask patterns 140a may be disposed on the magnetic tunnel junction parts 121. As described with reference to FIGS. 3A, 3B, 4A an 4B, the magnetic tunnel junction parts 121 may correspond to the portions of the magnetic tunnel junction layer 120 that are not injected with the impurities of the plurality of ion implantation processes. The isolation region 122a may correspond to a portion of the magnetic tunnel junction layer 120 that is injected with the impurities of the plurality of ion implantation processes.

The isolation region 122a may include first impurities, second impurities different from the first impurities, and an element the same as at least one of the elements included in the magnetic tunnel junction part 121. The first impurities may provide a magnetic isolation property to the isolation region 122a. The second impurities may provide an electrical isolation property and a magnetic isolation property to the isolation region 122a. The first impurities may include at least one of arsenic (As), phosphorus (P), nitrogen (N), boron (B), carbon (C), silicon (Si), gallium (Ga), germanium (Ge), selenium (Se), indium (In), tin (Sn), antimony (Sb), lead (Pb), neon (Ne), argon (Ar), krypton (Kr), and xenon (Xe). The second impurities may include at least one of oxygen (O) and nitrogen (N). The second impurities may include only oxygen (O).

As illustrated in FIG. 7B, each magnetic tunnel junction part 121 may include a reference pattern 51, a free pattern 71, and a tunnel barrier pattern 61 disposed between the reference and free patterns 51 and 71. The reference pattern 51 has a magnetization direction 300 fixed in one direction. The free pattern 71 has a magnetization direction 310 changeable between a parallel direction and an anti-parallel direction relative to the magnetization direction 300 of the reference pattern 51. In some embodiments, the magnetization directions 300 and 310 of the reference and free patterns 51 and 71 may be substantially perpendicular to a top surface of the substrate 100, as illustrated in FIG. 7B. In other embodiments, magnetization directions 400 and 410 of reference and free patterns 51a and 71a of a magnetic tunnel junction part 121a may be parallel to the top surface of the substrate 100, as illustrated in FIG. 8. Materials and/or structures of the reference and free patterns 51, 51a, 71 and 71a may be the same as or similar to those of the reference and free layers 50 and 70 described with reference to FIGS. 1A and 1B. In FIG. 8, a reference designator "61a" denotes a tunnel barrier pattern. The tunnel barrier patterns 61 or 61a may be formed of substantially the same material as the tunnel barrier layer 60 described with reference to FIGS. 1A and 1B.

The magnetization direction 310 or 410 of the free pattern 71 or 71a may be changed by spin torque of electrons in a program current flowing through the magnetic tunnel junction part 121 or 121a.

Lower electrodes 110a may be disposed under corresponding ones of the magnetic tunnel junction parts 121. Here, the isolation region 122a extends downward to also be disposed between the lower electrodes 110a. In other words, the lower electrodes 110a are electrically isolated from each other by the isolation region 122a. At least a lower portion of the isolation region 122a, disposed between the lower electrodes 110a, may further include an element that is the same as an element included in the lower electrode 110a. The lower electrodes 110a may be in contact with bottom surfaces of corresponding ones of the magnetic tunnel junction parts 121. The lower electrodes 110a may be disposed on the lower interlayer insulating layer 103 and may be connected to corresponding ones of the contact plugs 105.

Each of the mask patterns 140a may include an upper electrode 130a. The upper electrode 130a may be in contact with a top surface of the magnetic tunnel junction part 121. In some embodiments, the upper electrodes 130a may include a conductive barrier pattern 125a and a metal pattern 127a that are sequentially stacked. The mask pattern 140a may further include a hardmask pattern 135a disposed on the upper electrode 130a. In some embodiments, the hardmask pattern 135a may be omitted.

In some embodiments, a top surface of the isolation region 122a may be lower than the top surfaces of the magnetic tunnel junction parts 121. First and second capping insulating spacers 145a and 155a may be sequentially stacked on a sidewall of each mask pattern 140a. Alternatively, the first and second capping insulating spacers 145a and 155a may be omitted.

A protection insulating layer 165 may be conformally disposed on the mask patterns 140a and the isolation region 122a. An upper interlayer insulating layer 170 may be disposed on the protection insulating layer 165. Upper contact plugs 175 may penetrate the upper interlayer insulating layer 170, the protection insulating layer 165, and the hardmask patterns 135a. The upper contact plugs 175 may be connected to corresponding ones of the upper electrodes 130a, respectively. An interconnection 180 may be disposed on the upper interlayer insulating layer 170 and may be connected to each of the upper contact plugs 175 arranged along one direction.

The magnetic memory devices in the aforementioned embodiments may be encapsulated using various packaging techniques. For example, the magnetic memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the magnetic memory device according to one of the above embodiments is mounted may further include at least one semiconductor device (e.g., a controller and/or a logic device) that controls the semiconductor memory device.

Figure 9:
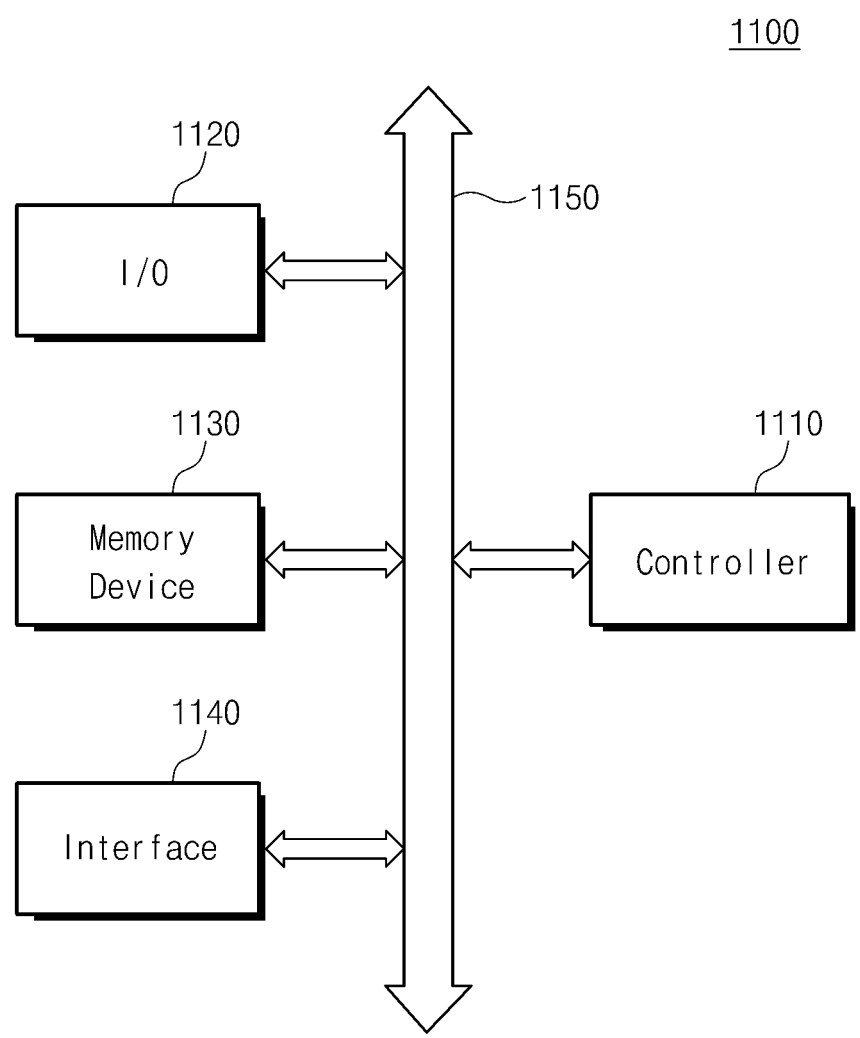
FIG. 9 is a schematic block diagram illustrating an electronic system including magnetic memory devices according to example embodiments of the inventive concepts.

FIG. 9 is a schematic block diagram illustrating an example of an electronic system including magnetic memory devices according to embodiments of the inventive concepts.

Referring to FIG. 9, an electronic system 1100 according to an embodiment of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller and/or a logic device. The I/O unit 1120 may include a keypad, a keyboard and/or a display unit. The memory device 1130 may store data and/or commands. The memory device 1130 may include at least one of the magnetic memory devices according to the embodiments described above. The memory device 1130 may further include another type of semiconductor memory device that is different from the magnetic memory devices in the aforementioned embodiments. For example, the memory device 1130 may further include a flash memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate wirelessly or through a cable or other wired connection. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may, for example, be implemented in a personal digital assistant (PDA), a portable computer, a web tablet, a wireless phone, a mobile phone, a digital music player, a memory card or other electronic products. The other electronic products may receive or transmit information data by wireless communication.

Figure 10:
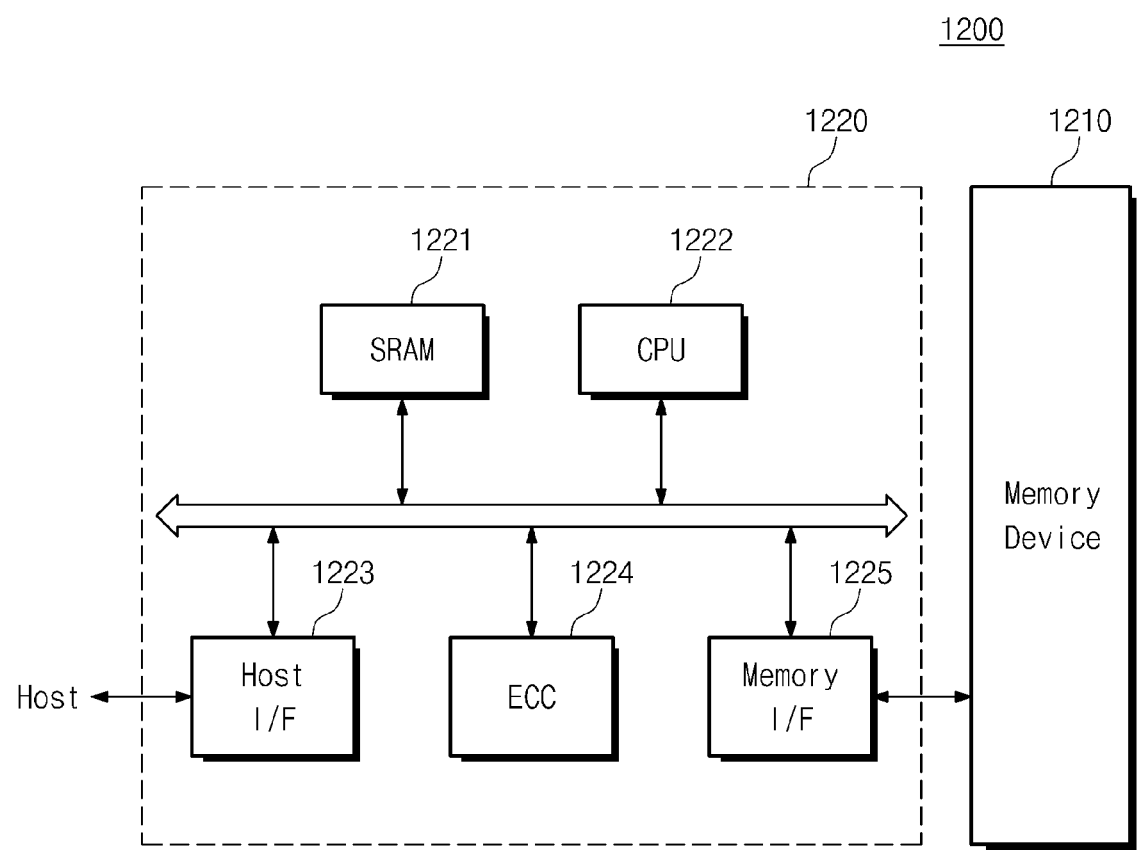
FIG. 10 is a schematic block diagram illustrating a memory card including magnetic memory devices according to example embodiments of the inventive concepts.

FIG. 10 is a schematic block diagram illustrating an example of a memory card including magnetic memory devices according to embodiments of the inventive concepts.

Referring to FIG. 10, a memory card 1200 according to an embodiment of the inventive concepts may include a memory device 1210. The memory device 1210 may include at least one of the magnetic memory devices according to the embodiments mentioned above. Additionally, the memory device 1210 may further include another type of semiconductor memory device that is different from the magnetic memory devices according to the embodiments described above. For example, the memory device 1210 may further include a phase change memory device, a flash memory device, a DRAM device and/or a SRAM device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as a solid state disk (SSD) used as a hard disk of a computer system.

As described above, the plurality of ion implantation processes may be sequentially performed using the mask patterns as ion implantation masks to form the isolation region in the magnetic tunnel junction layer. The isolation region defines the magnetic tunnel junction parts. The isolation region electrically and magnetically isolates the magnetic tunnel junction parts from each other. Accordingly, the magnetic tunnel junction parts need not be physically separated from each other by an etching process. Thus, various problems caused by the etching process can be avoided. For example, it is possible to prevent a process margin deficiency caused by pitch reduction and/or a short fail caused by an etch byproduct.

Additionally, since the isolation region is formed by sequentially performing the plurality of ion implantation processes, the doses of the ion implantation processes can be reduced. Thus, damage of the mask patterns caused by high-dosage ion implantation processes may be reduced or minimized.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but are merely illustrative. Thus, the scope of the inventive concepts are to be determined by the broadest permissible interpretation of the following claims and their equivalents, and should not be restricted or limited by the foregoing description.

What is claimed is:

1. A method of manufacturing a magnetic memory device, the method comprising:

forming a magnetic tunnel junction layer on a substrate;

forming mask patterns on the magnetic tunnel junction layer;

conformally forming a first capping insulating layer on the substrate having the mask patterns;

performing a first ion implantation process on the substrate having the first capping insulating layer using the mask patterns as ion implantation masks to form an amorphous region in the magnetic tunnel junction layer;

conformally forming a second capping insulating layer on the substrate after performing the first ion implantation process; and performing a second ion implantation process on the substrate having the second capping insulating layer using the mask patterns as ion implantation masks to transform the amorphous region into an isolation region in the magnetic tunnel junction layer, wherein the isolation region defines magnetic tunnel junction parts, wherein the magnetic tunnel junction parts are disposed under corresponding mask patterns, wherein metal atoms in the isolation region are segregated to a top surface of the isolation region by the first and second ion implantation processes, and wherein the method further comprises:

anisotropic etching the first and second capping insulating layers to form a first capping insulating spacer and a second capping insulating spacer on a sidewall of each of the mask patterns after forming the isolation region; and removing at least a portion of the segregated metal atoms from the top surface of the isolation region using the anisotropic etching process.

2. The method of claim 1, wherein the first ion implantation process implants first impurities and the second ion implantation process implants second impurities.

3. The method of claim 2, wherein the first impurities are different from the second impurities.

4. The method of claim 2, wherein the first impurities are selected from a first impurity group and the second impurities are selected from a second impurity group, and wherein one of the first and second impurity groups imparts a magnetic isolation property to the isolation region, and wherein the other of the first and second impurity groups imparts an electrical isolation property and a magnetic isolation property to the isolation region.

5. The method of claim 1, wherein the second ion implantation process is performed on the amorphous region.

6. The method of claim 1, further comprising:

forming a lower electrode layer on the substrate before forming the magnetic tunnel junction layer, wherein performing the first ion implantation process comprises performing the first ion implantation process using the mask patterns as ion implantation masks to form the amorphous region in the magnetic tunnel junction layer and the lower electrode layer, wherein performing the second ion implantation process comprises performing the second ion implantation process using the mask patterns as ion implantation masks to transform the amorphous region into the isolation region in the magnetic tunnel junction layer and the lower electrode layer, and wherein the isolation region further defines lower electrodes that are disposed under corresponding ones of the magnetic tunnel junction parts.

7. The method of claim 1, wherein the mask patterns include upper electrodes, and wherein each of the upper electrodes is in contact with a top surface of a corresponding one of the magnetic tunnel junction parts.

8. The method of claim 1, wherein the first ion implantation process implants first impurities at a first dose and the second ion implantation process implants second impurities at a second dose that is different from the first dose.

* * * * *